United States Patent [19]

Underhill

[11] Patent Number: 4,536,718
[45] Date of Patent: Aug. 20, 1985

[54] JITTER REDUCTION CIRCUIT FOR FREQUENCY SYNTHESIZER

[75] Inventor: Michael J. Underhill, Faygate, England

[73] Assignee: U.S. Philips Corporation, New York, N.Y.

[21] Appl. No.: 462,660

[22] Filed: Jan. 31, 1983

[30] Foreign Application Priority Data

Mar. 15, 1982 [GB] United Kingdom ............... 8208095

[51] Int. Cl.³ .............................................. H03L 7/18
[52] U.S. Cl. ....................................... 331/16; 331/17; 331/25
[58] Field of Search ...................... 331/1 A, 16, 17, 18, 331/25; 328/14, 25, 30; 377/48

[56] References Cited

U.S. PATENT DOCUMENTS 4,179,670 12/1979 Kingsbury ........................ 331/16 X
4,380,743 4/1983 Underhill et al. ................... 331/1 A
4,468,632 8/1984 Crowley ............................ 331/25 X

FOREIGN PATENT DOCUMENTS 1447418 8/1976 United Kingdom .

Primary Examiner—Siegfried H. Grimm
Attorney, Agent, or Firm—Joseph P. Abate

[57] ABSTRACT

A frequency synthesizer of the type employing a cycle cancellation technique and providing a correction signal which at least reduces the jitter in the output frequency caused by each cancelled cycle. A control device (CD) causes cycles to be added (PA) and cancelled (PS) without affecting the average frequency (Fc). A compensation signal for the resultant jitter is also generated (DAC and I) which is combined with the correction signal in an adder (AS) and with the frequency control voltage signal from the phase comparator (PC) in a further adder (ASD).

10 Claims, 4 Drawing Figures

JITTER REDUCTION CIRCUIT FOR FREQUENCY SYNTHESIZER

BACKGROUND OF THE INVENTION

This invention relates to a frequency synthesizer comprising a reference frequency generator, a frequency control circuit which includes a variable frequency reduction means comprising a cycle cancellation circuit which is arranged to cancel a cycle of the frequency to be reduced by the reduction means for each input pulse to said cancellation circuit from a pulse source, and a jitter compensation signal circuit connected to the frequency control circuit, the output signal of the jitter compensation signal circuit being arranged to compensate, at least partly, for any jitter in the period of the output frequency that would otherwise be caused by each cancelled cycle.

Such frequency synthesizers are known and are either of the "direct" type in which the output frequency is derived directly from the reference frequency or of the indirect, or phase lock loop type in which the output frequency is generated by a variable frequency oscillator forming part of a phase lock loop which locks the oscillator to a predetermined rational fraction, which is to be understood as including a multiple, of the reference frequency.

Examples of direct frequency synthesizers are described in U.K. Patent Specifications Nos. 1,545,953 and 2,062,315, and examples of phase lock loop synthesizers are described in U.K. Patent Specifications Nos. 1,447,418 and 2,068,185A. In each type, it is known to include in the frequency reduction means a variable modulus divider to provide the major part of the required frequency reduction. Such dividers generally produce spectrally pure frequencies which are exact subharmonics of the frequency which is to be divided. The frequencies other than subharmonics are produced by a cycle cancellation technique in which selected cycles of the frequency to be reduced are cancelled. Such a technique is well known and is alternatively referred to as sidestep programming (see, for example, A. F. Evers and D. J. Martin, "Improved forms of digital frequency synthesisers", *IEE Colloquium Digest* 1972/11, pp. 9/1 to 9/5), pulse blanking, pulse removal, pulse cancellation, and pulse or cycle swallowing. The technique is also described in *Mullard Technical Note* 142 "Versatile LSI frequency synthesiser" pp. 8, 9.

For example, a frequency synthesizer may have a range of 1.6 MHz to 30 MHz adjustable by means of one or more modulo-N dividers where N is adjustable to provide the range in 1 kHz steps. These steps may then be further subdivided by the use of a rate, or fractional, multiplier which, for example, produces an output frequency variation of 0 to 990 Hz in 10 Hz fractional steps. In this manner, the whole range 1.6 MHz to 30 MHz is covered in 10 Hz fractional steps. The adjustable frequency given by these fractional steps is usually referred to as the offset frequency and is provided by means of a cycle cancellation circuit controlled by the output of the rate multiplier which constitutes the above-mentioned pulse source.

In the prior art devices, the pulse source derives the cycle-cancelling pulses from the reference frequency or from the variable frequency oscillator, typically by means of at least a programmable rate multiplier which produces a programmable number of output pulses for a fixed number of input pulses. These output pulses have an average frequency which can be any rational fraction of the frequency from which they are derived. Since they are strobed by the input pulses, however, the periods between successive output pulses may vary due to the missing pulses and these variations (referred to as "jitter") would produce variations in the output frequency unless said compensation circuit is provided to reduce the effects of the jitter.

In the frequency synthesizer described in the above-mentioned patent specification No. 1,447,418, the frequency reduction is partly effected by a successive addition rate multiplier which, for each input pulse thereto, adds a programmable increment to an accumulated value and gives an output pulse each time the capacity of the accumulator is exceeded, leaving the excess as a residue in the accumulator. The principle of its operation can readily be appreciated by taking a simple example in which the capacity of the accumulator is unity and each input pulse adds 0.7 to the value in the accumulator. Thus, the accumulator overflows and gives an output pulse for the 2nd, 3rd, 5th, 6th, 8th, 9th and 10th input pulses—i.e. seven output pulses for ten input pulses. In other words, the average pulse repetition rate has been multiplied by 0.7 by the rate multiplier.

The said patent specification describes a phase lock loop system in which the residue in the accumulator is converted to analogue form in a digital-to-analogue converter and the resultant analogue signal is used to compensate for any variation in the output of a phase comparator, in the phase lock loop, due to jitter.

If there is any residual imbalance in the jitter compensation arrangement, this imbalance appears in the output frequency as a spurious discrete signal. This signal may typically be 30 dB down with respect to the main output signal and while this is adequate in the audio pass band in communication receivers, it is not adequate for broadcast receivers. If, for example, the output frequency is 100 kHz and the offset frequency is 12.5 kHz, any spurious signal would be in the adjacent channel, whereas the specification for such equipment requires the level of any such signal to be at least 90 dB down. An object of the invention is at least to mitigate this problem.

SUMMARY OF THE INVENTION

According to the invention there is provided a frequency synthesizer comprising a reference frequency generator, a frequency control circuit which includes a programmable frequency reduction means comprising a cycle cancellation circuit arranged to cancel a cycle of a frequency to be reduced by the frequency reduction means for each input pulse to said cancellation circuit from a pulse source, and a jitter compensation signal circuit connected to the frequency control circuit, the output signal of the jitter compensation signal circuit being arranged to compensate, at least partly, for any jitter in the period of the output frequency of the synthesizer that would otherwise be caused as a result of each cancelled cycle, characterized in that the synthesizer further includes a control device the control signal output of which is arranged to cause the frequency control circuit to cancel cycles from, and also to add cycles to, the frequency to be reduced at a given combined rate, and a control signal compensation circuit connected to the control device and arranged to produce an output signal which is a function of the control signal, the output of the control signal compensation circuit being so connected in the synthesizer circuit as to compensate for any jitter in the output frequency of the synthesizer that would otherwise be caused by the control signal.

The principle used in the synthesizer according to the invention is, in addition to the normal cycle cancellation and compensation, deliberately to add and cancel further cycles of the frequency to be reduced and then to compensate for the jitter that these added and subtracted pulses would otherwise inevitably cause. In a frequency synthesizer of the type described in the opening paragaraph, any residual imbalance in the compensation circuit would give rise to a spurious sideband signal having a discrete frequency determined by the offset frequency. The effect of adding and subtracting pulses in a synthesizer according to the invention is to introduce a perturbation signal into the system. In the event of any residual imbalance in the compensation circuit, the energy in the spurious discrete signal is mixed with the perturbation signal and is spread over a wide spectrum with the result that it appears as noise at a considerably lower level.

It is not essential for the control device to be arranged to add the same number of cycles as its cancels—any difference between the numbers merely represents a frequency offset. Preferably, however, the number of added cycles is substantially the same as the number of cancelled cycles in any given period, since substantially no frequency offset is then caused.

The control signal output of the control device may have three states—namely, a first state which causes a pulse to be cancelled, a second (neutral) state which causes no pulse addition or cancellation, and a third state which causes a pulse to be added.

The control signal may comprise at least first and second interspersed pulse sequences, the arrangement being such that each pulse of the first sequence causes a cycle to be cancelled from, and each pulse in the second sequence causes a cycle to be added to, the frequency to be reduced. By interspersing the sequences, the instantaneous frequency of the frequency to be reduced is, at any instant, closer to its average frequency than would be the case if a long series of cancelled pulses were followed by a long series of corresponding added pulses. The minimum instantaneous deviation from the average frequency is given if the pulses of the two sequences are arranged alternately.

A very considerable advantage accrues, however, if the two pulse sequences are interspersed and occur in a random manner. Any phase jitter energy in the output frequency caused by any residual imbalance in the compensation signals is then made completely noise-like and is spread over such a wide spectrum that it is substantially undetectable. Substantially the same spreading effect can be achieved, but in a more convenient practical manner, if the two sequences together form a pseudo-random sequence since such sequences may easiy be generated in well known manner.

In order to minimize the amount of jitter resulting from the control signal, the latter may be in Manchester-coded form or may be a differentiated code signal. In this context, differentiation means converting a rising transition of a clocked input signal to a +1 output signal, a falling transition to a −1 output signal and the lack of a transition to a 0.

The synthesizer may include means for combining the outputs of the jitter and control signal compensation circuits to form a combined compensation signal. Thus, only a single correction signal need be applied to the jitter correction arrangement, for example, a phase modulator or a programmable delay generator. Although the principle of operation of a phase modulator in this art is usually different from that of a programmable delay generator, the effect of each for present purposes is substantially the same.

The frequency synthesizer may include a detector arranged to detect any residual jitter in the circuit after application of the combined compensation signal, and a variable gain amplifier arranged to control the amplitude of the combined compensation signal, the gain of the amplifier being controlled by the detector to reduce any said residual jitter. In this manner, the detector and the amplifier form an automatic servo which adjusts the amplitude of the compensation signal in dependence upon the detected inaccuracy in order to minimize that inaccuracy.

The frequency synthesizer described in the above-mentioned U.K. Patent Specification No. 2,068,185A employs such an automatic servo. However, after a frequency step change in which the offset frequency step size is a small fraction of the main step size, the servo may take some little time to settle. This time, although adequate for many purposes, may be too long for the frequency synthesizer to be used, for example, in frequency-hopping radio systems or as a microwave synthesizer. The reason for this delay in the settling time can be explained by taking the example referred to above in which the main step size is 1 kHz and the offset frequency is adjustable in 10 Hz steps. The fractional step is thus 0.01 and the servo receives information at the 10 Hz rate; that is to say that in the worst case the servo may have to wait for one-tenth of a second before it senses whether or not the system has any residual imbalance. For this reason, it is necessary to include a time constant in the servo loop to ensure satisfactory operation under the worst case conditions where the offset frequency is 10 Hz or 990 Hz.

By adding and subtracting pulses in response to the control signal as in a synthesizer according to the invention, however, the servo loop is additionally responding to these jitter-creating pulses—that is to say that the input information is applied to the servo at a higher rate and, therefore, any time constant applied to the servo loop can be very considerably shorter. Thus, the frequency synthesizer has a far more rapid response to changes in the required frequency and this very considerably extends its utility.

Said given combined rate is preferably between one-twentieth and three times the maximum pulse repetition rate of pulses from the pulse source. The applicants have found that no significant worthwhile advantage in the spreading of the spectrum is achieved if the combined rate is less than one-twentieth of said maximum pulse repetition rate and that no significant further reduction of the settling time of the servo is achieved if the combined rate is more than three times said maximum repetition rate.

The pulse source may be a rate multiplier, in which case the given combined rate may conveniently be equal to the pulse repetition rate of pulses fed to the input of the rate multiplier. In this case, both the rate multiplier and the control device can be fed with the same pulses.

BRIEF DESCRIPTION OF THE DRAWING

Embodiments of the invention will now be described, by way of example, with reference to the accompanying drawings, of which.

DESCRIPTION OF THE PREFERRED EMBODIMENTS

Figure 1:
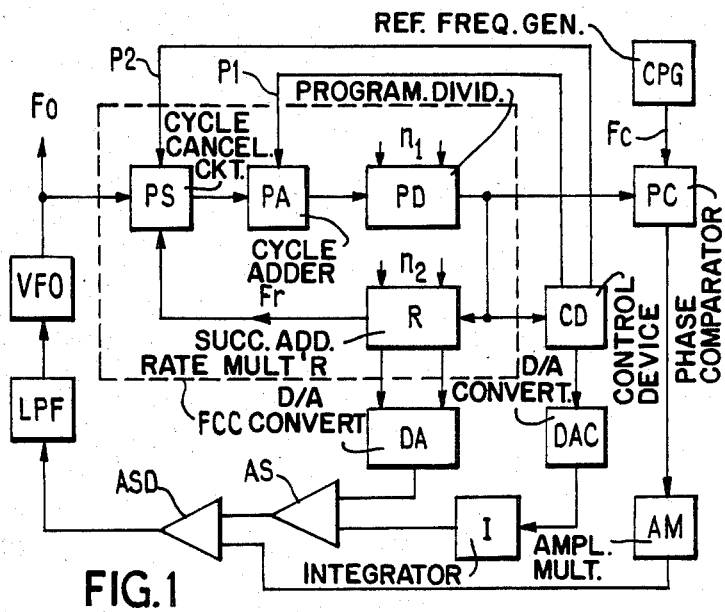
FIG. 1 is a block schematic circuit diagram of a first phase lock loop type of frequency synthesizer.
Figure 2:
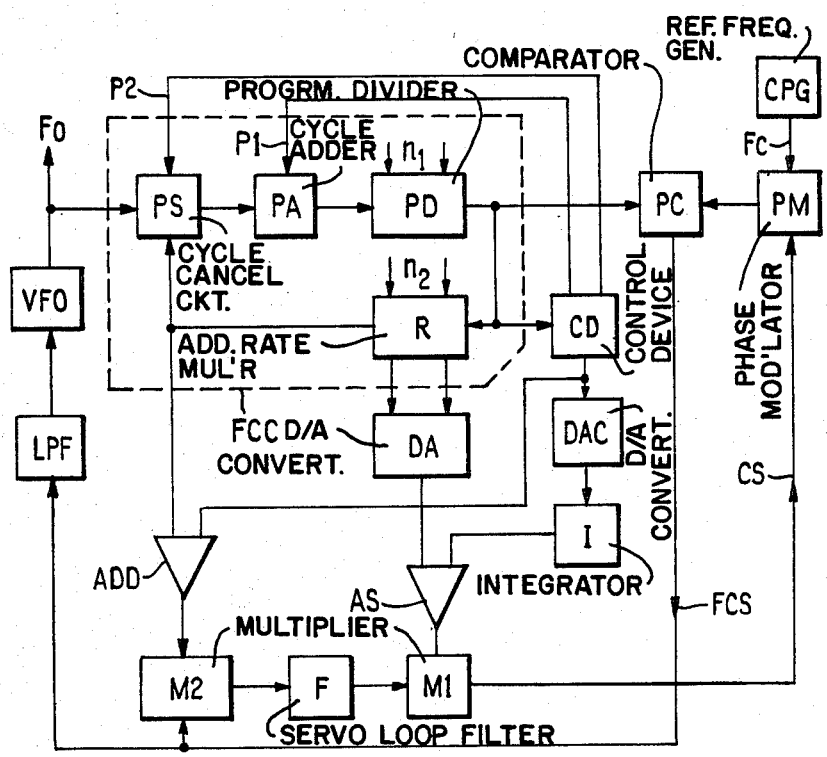
FIG. 2 is a block schematic circuit diagram of a similar phase lock loop type of frequency synthesizer including an automatic servo.

FIG. 1 shows an embodiment of the invention as applied to a frequency synthesizer of the type shown in FIG. 2 of United Kingdom Patent Specification No. 1,447,418, the present references used being the same as in said Figure. The circuit items common to both Figures are a voltage-controlled variable frequency oscillator VFO, a cycle cancellation circuit (pulse swallow) PS, a programmable divider PD, a phase comparator PC, a reference frequency (clock pulse) generator CPG, a successive addition rate multiplier R, a digital-to-analogue converter DA, an amplitude multiplier AM, an analogue summing device ASD, and a low pass filter LPF. The operation of this part of the circuit is fully described in said Patent Specification No. 1,447,418; so only a brief description of the operation of this basic part of the circuit will now be given.

Items CPG, PC, PD, VFO and LPF form a conventional phase lock loop type of synthesizer in which the frequency Fc of the generator CPG is compared in phase comparator PC with the output frequency Fo after division by divider PD. Any phase difference between the two inputs to comparator PC is represented by a proportionate signal at the output of comparator PC. This signal is integrated in filter LPF to produce a voltage at the control input of oscillator VFO, which voltage causes the phase of the output frequency to change until the two inputs to comparator PC are precisely in phase and $Fo=n_1 Fc$ where $n_1$ is the modulus of the divider PD.

In order to provide fractional step sizes, rate multiplier R multiplies the output frequency of divider PD by a factor $n_2 \leq 1$ and constitutes a pulse source the output pulses of which have an average frequency (pulse repetition rate) $F_R$ each pulse of which causes pulse swallow circuit PS to cancel a cycle of the frequency Fo. Thus, $Fo=(n_1+n_2)Fc$.

The swallowing action of circuit PS causes the period of the frequency appearing at the input of phase comparator PC from divider PD to jitter and this causes consequent phase jitter in the output signal of comparator PC.

To compensate for this jitter, a compensation signal circuit is provided comprising a digital-analogue converter DA which converts the accumulated digital content of rate multiplier R to an analogue value, an amplitude multiplier AM which adjusts the level of the output signal of comparator PC to be commensurate with the output signal from converter DA to provide the required degree of compensation, and an analogue summing device ASD which combines the control and compensation signals in such a direction that the jitter content in the output signal from comparator PC is exactly offset by a corresponding content in the output from converter DA.

In addition to the known circuit so far described, this embodiment of a frequency synthesizer according to the invention further comprises a cycle (pulse) adder PA between pulse swallow circuit PS and divider PD, a control device CD fed with synchronizing pulses from the output of divider PD, a digital-analogue converter DAC, an integrator I, and a further analogue summing device AS. Control device CD has two outputs P1 and P2 at which respective interspersed pulse sequences appear. Each pulse on output P1 causes pulse adder PA to add a pulse (cycle) to the frequency Fo and each pulse on output P2 causes pulse swallow circuit PS to cancel a cycle of frequency Fo.

Circuit blocks PS, PA, PD and R form a frequency control circuit FCC to which control device CD is connected.

The pulses on outputs P1 and P2, referred to as +1 and −1 pulses respectively, are interspersed and have in this embodiment a combined rate equal to the frequency $Fc-1/t$ of the inputs to comparator PC (since in operation both inputs to comparator PC have the frequency Fc) and equal to or greater than the frequency Fr, depending upon the value of $n_2$. Over consecutive time periods, which can each be as short as 2t, a substantially equal number of +1 and −1 pulses are generated, each strobed by the input to control device CD from the frequency control circuit FCC. Over a time average, therefore, there is no net phase error introduced by this action and so the process generates no frequency error in the system.

Device CD also provides a combined control signal to digital-to-analogue converter DAC which, with integrator I, generates an analogue compensation signal which is a function of the jitter in the control signal P1+P2 and which is arranged to cancel the phase jitter introduced by the +1 and −1 signals fed to pulse adder PA and pulse swallower PS as part of the divider arrangement in circuit FCC. To achieve this, the analogue signal output from integrator I is added in exactly correct proportion in analogue summing device AS with the phase predicting analogue compensation signal already generated by digital-to-analogue converter DA to cancel the phase jitter caused by generating a fractional step frequency offset.

As is well known, the pulse swallow circuit PS might comprise a so-called $n/(n+1)$ prescaler which divides by n (e.g. 10) in the absence of a control pulse and by (n+1) if a control pulse from multiplier R is present. In a similar manner, pulse adding circuit PA may comprise an $n/(n-1)$ prescaler. Alternatively, the pulse adder PA may comprise a divide-by-two circuit, for example forming the first stage of divider PD, which normally divides by 2 but which divides by 1 for each P1 pulse. Alternatively, the functions of circuits PA, PS, and PD can be performed by a modulo-$(n-1)/n/(n+1)$ divider as described in the specification of U.K. patent application No. 2,074,421A.

In principle, the +1 and −1 pulses could be interspersed with 0 periods in which the effective division ratio of the divider arrangement is $n_1$, but then the compensation signal fed to summer AS would include information which apparently serves no useful purpose. However, in order to improve the noise-like nature of the signal, it may be advantageous to include a number of 0 periods.

The control signal from control device CD which would give the maximum rate of information would be alternate +1 and −1 pulses occurring at the comparator frequency Fc, giving a square wave of frequency Fc/2. The combined signal is, however, preferably derived from or forms a random or pseudo-random binary sequence which is then Manchester-coded (encoded in pairs of (+1, −1) or (−1, +1) depending upon the presence of a 0 or 1 respectively in the sequence) or is differentiated as described below. In some circumstances, it may be advantageous to differentiate the Manchester-coded signal. The random sequence has to be generated at a maximum rate of Fc and if it has a total period of T then its spectrum will be noise-like but with discrete components spaced by frequency $T^{-1}$. If T is less than about 100 mS for a typical communication synthesizer, the spectrum can be considered as pure noise. In this case, any energy in the output frequency resulting from imbalance in the compensation system will not appear as a discrete signal but will be spread out as a noise spectrum signal. In this manner, the total imbalance energy can be up to 30 dB greater than the maximum imbalance energy that would be tolerable without this spreading action and yet still be inaudible. The following example will serve to illustrate this.

The frequency synthesizer may be used in connection with a multi-channel communication system having, for example, a channel spacing of 12½ kHz. If the synthesizer frequency step is 100 kHz and, say, the fractional offset frequency is 12½ kHz, then a spurious 12½ kHz signal is produced which will be in the adjacent channel. Without special precautions, this signal would be 30 to 50 dB down with respect to the channel carrier but the CCITT specification requires it to be at least 90 dB down. This is readily achievable by the provision of the control signal having a random distribution.

If a pseudo-random binary sequence is used which is generated in well known manner from an N-stage shift register with feedback, $2^N-1$ different codes are generated. Every code is complemented by another particular code except the all-1's code since there is no complementary all-0's code. Thus, there is a small imbalance once in every complete sequence of $2^N-1$ codes. If the sequence is generated, for example by a shift register having N=17 stages clocked by a 1 MHz clock pulse, the total cycle length is $2^{17}-1=131,071$ bits, i.e. a rate of 7.63 Hz. Thus, there will be a very small imbalance at this rate giving a small offset in the final frequency which, in many cases, will be acceptable. Alternatively, the imbalance may be eliminated entirely by the use of the Manchester code or a differentiated code.

If, for reasons of imperfect compensation, some residual energy from the pseudo-random sequence causes phase jitter, the sideband components of this jitter wil be spaced at 7.63 Hz and, at that frequency spacing, the sideband energy becomes indistinguishable from white noise and is, therefore, substantially inaudible.

FIG. 2 shows an embodiment of a frequency synthesizer having a more complex compensation circuit and using a phase modulator to effect the jitter correction. This circuit is closely similar to FIG. 1 and circuit blocks VFO, PS, PA, PD, PC, CPG, LPF, R, DA, AS, CD, DAC, and I have precisely the same functions as described above. Additional circuit blocks are a digital adder ADD, two multipliers M1 and M2, a servo loop filter F, a summing device SD, and a phase modulator PM. With the exception of blocks ADD, CD, DAC, I, and AS, which are relevant to the present invention, the circuit and its operation is fully described with reference to FIG. 2 of U.K. Patent Specification No. 2,068,185A. The multiplier M2 functions as a correlator and detects any uncancelled component in the output of phase comparator PC which is correlated with the signals from R and CD which originally caused the phase jitter. The filter F serves to create a running input to multiplier M1 to ensure the correct amplitude of the cancellation signal from analogue summer AS which is fed to the phase modulator PM. The multiplier circuit M1-F-M2 thus provides additional compensation if there is any residual ripple in the frequency control signal FCS which is fed to the variable frequency oscillator VFO from phase comparator PC. In this case, the correction signal is not only a function of the jitter as represented by the output of digital-to-analogue converter DA but is also a function of any ripple appearing on the frequency control signal FCS, the latter function being derived via one input of the multiplier M2 and filter F. The two analogue functions are then combined in multiplier M1.

Additional circuit blocks CD, PA, DAC, I, and AS are the same as shown in FIG. 1 and have the same function. In this case, however, the output of device CD is combined with the pulse swallow output of rate multiplier R in digital adder ADD, the output of which is fed to correlating multiplier M2 together with the overflow pulses from rate multiplier R. The correlation between the inputs to multiplier M2 is either positive or negative depending upon whether the correction signal CS is too large or too small. The overflow signals from rate multiplier R cause the output of multiplier M2 to be a function of the signals which in effect cause the jitter. Due to the use of two correction signals, the correlator can be arranged to operate without the input from rate multiplier R. It is, however, preferable for the two analogue correction signals to be preadjusted to be equal in effect or else the servo loop PC-FCS-M2-F-M1-PM-PC will attempt to adjust either to a compromise gain setting in the first case, or to a gain which only compensates for the control signal jitter and not the phase predict signal.

The combined compensation signals appearing at the output of multiplier M1 control the phase of a phase modulator PM such that the resultant phase jitter in the ouput of modulator PM is precisely the same as the phase jitter appearing at the output of divider PRD. Therefore, the output signal from the phase comparator PC is completely clear of any jitter content.

Figure 3:
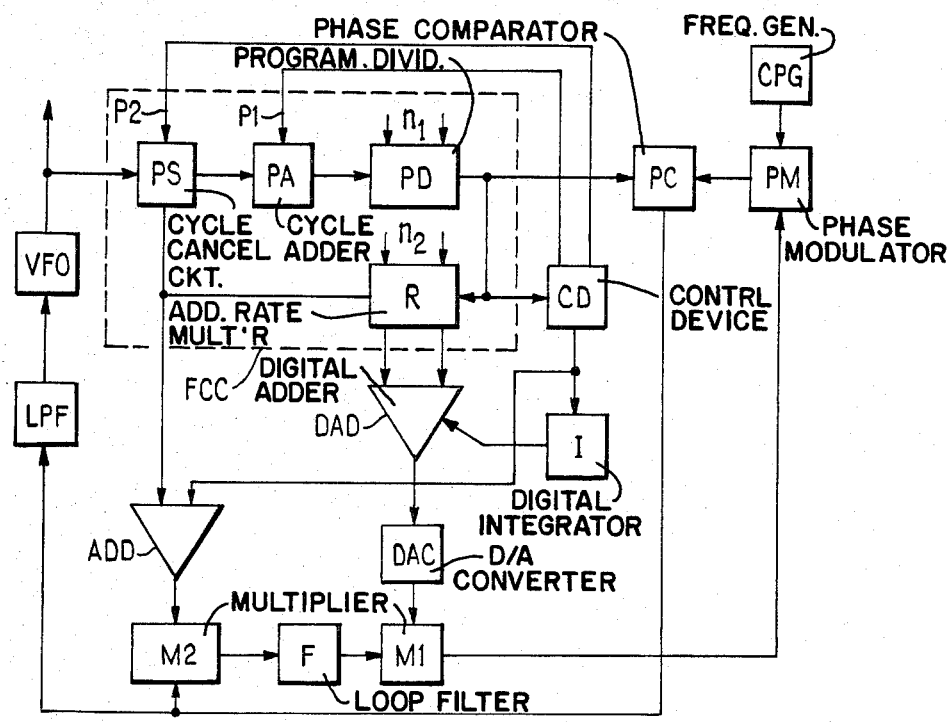
FIG. 3 is a modified version of the synthesizer shown in FIG. 2.

It will be evident to those skilled in the art that many alternative circuit arrangements are possible in order to achieve the same result, one example being given in FIG. 3 which is a modification of the circuit shown in FIG. 2. It is to be noted that the relative positions of digital-to-analogue converter DAC and integrator I can be reversed in the embodiment shown in FIG. 2. Advantage of this is taken in the circuit shown in FIG. 3 in order to enable the functions of digital-to-analogue converters DAC and DA to be combined.

In FIG. 3, integrator I is now a digital integrator, for example an up-down counter which responds to a train of bipolar pulses from device CD in which the P1 pulses have the value +1 and the P2 pulses have the value −1. The count value of integrator I is fed to a digital adder DAD which is also fed with the digital signal from rate multiplier R. The digital output of adder DAD is converted to an analogue signal by digital-to-analogue converter DAC the output of which is fed to multiplier M1.

Also, of course, in FIGS. 2 and 3 the positions of pulse swallow circuit PS and pulse adder circuit PA can be interchanged; that is to say that PA may be between the VFO and PS instead of between PS and PD.

The phase modulator PM in FIGS. 2 and 3 may alternatively be located in series with the input to the phase comparator PC from divider PD or in series with the output of comparator PC.

Figure 4:
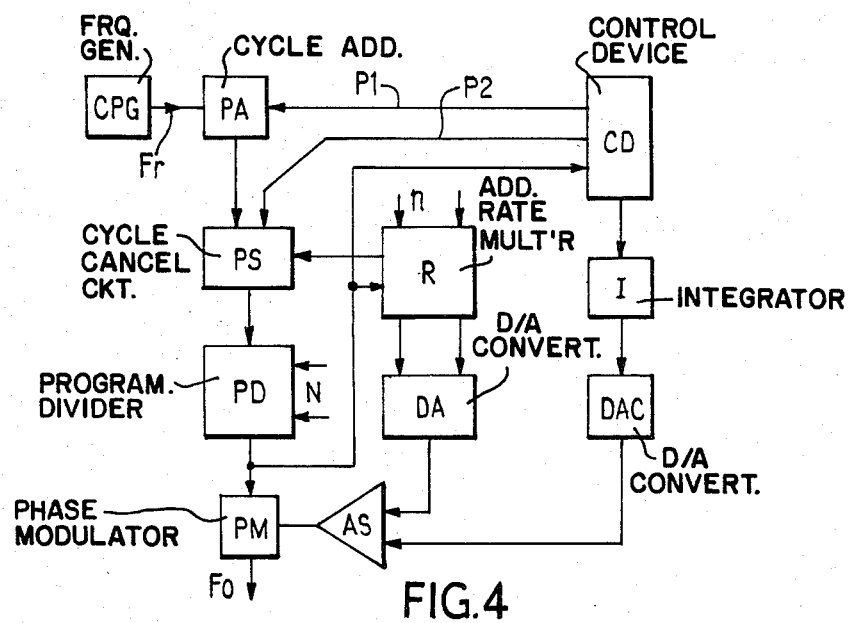
FIG. 4 is a block schematic circuit diagram of a direct type of synthesizer.

FIG. 4 shows an embodiment of a direct type of frequency synthesizer in accordance with the invention, which synthesizer includes a series circuit comprising a clock pulse generator CPG having a reference frequency (pulse repetition rate) Fc, a pulse adder PA, a pulse swallower (subtractor) PS, a modulo-N divider PD and a programmable delay (phase modulator) PM the output of which provides the required output frequency Fo. A control device CD is clocked by the output pulses from divider PD and provides a control signal comprising "add" and "subtract" pulses P1 and P2 respectively, together with a composite bipolar output signal of the add and subtract pulses as described above with reference to FIG. 3. The composite output signal is integrated by a digital integrator I (which may be an up-down counter) and converted to an analogue signal in digital-to-analogue converter DAC.

A rate multiplier R multiplies the frequency of the output pulses of divider PD by a value n≦1 with the result that, as is well known in the art, the output frequency Fo is equal to Fc/Nn where N and n are respectively the integer and fractional components of the required division ratio. The instantaneous digital value in the accumulator store in rate multiplier R is converted into an analogue signal by digital-to-analogue converter DA and fed to analogue summer AS together with the analogue output of converter DAC. The combined signal is fed as a delay control signal to the programmable delay PM.

The circuit blocks in FIG. 4 have the same functions as the circuit blocks in FIG. 3 having the same references and operate in the manner described above; that is to say that in addition to a jitter compensation signal derived from rate multiplier R, an additional predetermined "perturbation" signal generated by control device CD is injected into the series circuit CPG-PA-PS-PD-PM and is compensated for by a further compensation signal derived from device CD and fed to the programmable delay PM.

It is not essential that the input pulses to rate multiplier R and device CD are taken from divider PD. Either or both may, for example, be taken alternatively from reference frequency generator CPG or from the output of the synthesizer. The positions of the integrator I and digital-to-analogue converter DAC may be reversed, in which case the integrator I should be an analogue integrator.

From a theoretical point of view, the combined pulse repetition rate of the pulses forming the control signal can have any value, since even a few added or subtracted pulses inevitably spread the energy content of any spurious discrete signal over a wider spectrum and also speed up the servo action in those synthesizers having a servo. From a practical point of view, however, suitable results are obtained if the combined rate is between one-twentieth and three times the maximum pulse repetition rate from the pulse source.

In each of the foregoing embodiments, the control signal may be in Manchester-coded of differentiated code form as referred to above. The reason for such forms is that they cause minimum jitter and this can be explained by taking the case in which the control signal is derived from a pseudo-random binary sequence. One of the states in the sequence is the so-called "all 1's" state and if we take a very simple case where this state comprises only five 1's, then this would cause five pulses to be added consecutively by pulse adder PA—i.e. a maximum frequency deviation of +5 cycles. If this sequence is Manchester-coded, each "1" of the original code causes a pulse to be added and a pulse to be subtracted (not necessarily in that order). Thus, at any instant, the maximum frequency deviation is +1 or −1 cycle. The maximum frequency deviation, however, occurs at transitions—for example the state 010 may appear as 011001 in Manchester-coded form, the maximum deviation then being ±2 cycles. The differentiated code for the 11111 state, assuming that the 1's sequence has a 0 at each end, is +1, 0, 0, 0, 0, −1, i.e. the maximum frequency deviation is then only ±1 cycle.

Thus, the use of such coded signals for the control signal restricts the phase excursion of the signal and, hence, reduces the consequent jitter caused by the control signal.

I claim:

1. A frequency synthesizer comprising a reference frequency generator, a frequency control circuit which includes programmable frequency reduction means comprising a cycle cancellation circuit arranged to cancel a cycle of a frequency to be reduced by the frequency reduction means for each input pulse to said cancellation circuit from a pulse source, and a jitter compensation signal circuit connected to the frequency control circuit, the output signal of the jitter compensation signal circuit being arranged to compensate, at least partly, for any jitter in the period of the output frequency of the synthesizer that would otherwise be caused as a result of each cancelled cycle, characterised in that the synthesizer further includes a control device the control signal output of which is arranged to cause the frequency control circuit to cancel cycles from, and also to add cycles to, the frequency to be reduced at a given combined rate, and a control signal compensation circuit connected to the control device and arranged to produce an output signal which is a function of the control signal, the output of the control signal compensation circuit being so connected in the synthesizer circuit as to compensate for any jitter in the output frequency of the synthesizer that would otherwise be caused by the control signal.

2. A frequency synthesizer as claimed in claim 1, wherein the number of cycles added by the control signal in a given period is substantially the same as the number of cycles cancelled by the control signal in that period.

3. A frequency synthesizer as claimed in claim 1 or 2, wherein the control device is so arranged that the control signal comprises at least first and second interspersed pulse sequences, the arrangement being such that each pulse of the first sequence causes a cycle to be cancelled from, and each pulse of the second sequence causes a cycle to be added to, the frequency to be reduced.

4. A frequency synthesizer as claimed in claim 3, wherein the two sequences together form a pseudo-random sequence.

5. A frequency synthesizer as claimed in claim 2, wherein the control signal has a Manchester-coded form.

6. A frequency synthesizer as claimed in claim 2, wherein the control signal is a differentiated code signal.

7. A frequency synthesizer as claimed in claim 1, including means for combining the outputs of the jitter and control signal compensation circuits to form a combined compensation signal.

8. A frequency synthesizer as claimed in claim 1, including a detector arranged to detect any residual jitter in the circuit after the application of said combined compensation signal, and a variable gain amplifier arranged to control the amplitude of the combined compensation signal, the gain of the amplifier being controlled by the detector to reduce any said residual jitter.

9. A frequency synthesizer as claimed in claim 1, wherein the said given combined rate is between one-twentieth and three times the maximum pulse repetition rate of pulses provided by the pulse source.

10. A frequency synthesizer as claimed in claim 9, wherein the pulse source is a rate multiplier and the given combined rate is equal to the pulse repetition rate of pulses fed to the input of the rate multiplier.

* * * * *